(12) United States Patent
Ebner et al.

(10) Patent No.: US 12,404,601 B2
(45) Date of Patent: Sep. 2, 2025

(54) METHOD FOR GROWING CRYSTALS

(71) Applicant: EBNER Industrieofenbau GmbH, Leonding (AT)

(72) Inventors: Robert Ebner, Leonding (AT); Kanaparin Ariyawong, Leonding (AT); Ghassan Barbar, Neunkirchen (DE); Chih-Yung Hsiung, Leonding (AT)

(73) Assignee: EBNER Industrieofenbau GmbH, Leonding (AT)

(*) Notice: Subject to any disclaimer, the term of this patent is extended or adjusted under 35 U.S.C. 154(b) by 260 days.

(21) Appl. No.: 18/028,685

(22) PCT Filed: Sep. 23, 2021

(86) PCT No.: PCT/AT2021/060343
§ 371 (c)(1),
(2) Date: Mar. 27, 2023

(87) PCT Pub. No.: WO2022/061388
PCT Pub. Date: Mar. 31, 2022

(65) Prior Publication Data
US 2023/0357951 A1     Nov. 9, 2023

(30) Foreign Application Priority Data
Sep. 28, 2020    (AT) .............. A 50821/2020

(51) Int. Cl.
*C30B 23/06*      (2006.01)
*C30B 23/00*      (2006.01)
(Continued)

(52) U.S. Cl.
CPC ............ *C30B 23/002* (2013.01); *C30B 23/06* (2013.01); *C30B 25/10* (2013.01); *C30B 25/16* (2013.01); *C30B 29/36* (2013.01)

(58) Field of Classification Search
CPC ....... C30B 23/002; C30B 23/06; C30B 25/10; C30B 25/16; C30B 29/36
See application file for complete search history.

(56) References Cited

U.S. PATENT DOCUMENTS

| 4,578,146 A | 3/1986 | Chai et al. |
| 6,048,398 A | 4/2000 | Vehanen et al. |

(Continued)

FOREIGN PATENT DOCUMENTS

| CN | 101003914 A | 7/2007 |
| CN | 102596804 A | 7/2012 |

(Continued)

OTHER PUBLICATIONS

International Search Report in PCT/AT2021/060339, mailed Dec. 21, 2021.

(Continued)

*Primary Examiner* — Robert M Kunemund
(74) *Attorney, Agent, or Firm* — Collard & Roe, P.C.

(57) ABSTRACT

A method for growing crystals using PVT or PVD or CVD, includes: providing: a chamber for crystal growth, a crucible in the chamber including at least one deposition section with a seed crystal and a base material for crystal growth, at least one temperature monitoring device, a gas supply device and at least one fluid inlet and outlet, and a pressure monitoring device; evacuating the chamber using a pumping device; flushing the chamber with inert gas; heating the chamber to a growth temperature of 2000 to 2400° C. using at least one heating device; decreasing pressure to 0.1 to 100 mbar; supplying a dopant (during a growth process); regulating process parameters in the growth process; increasing chamber pressure at the growth process end; cooling down the (Continued)

chamber; wherein the heating of the chamber from an ambient temperature to the growth temperature occurs within 10 to 10000 minutes.

13 Claims, 3 Drawing Sheets

(51) Int. Cl.
    *C30B 25/10*     (2006.01)
    *C30B 25/16*     (2006.01)
    *C30B 29/36*     (2006.01)

(56) References Cited

U.S. PATENT DOCUMENTS

| | | | |
|---|---|---|---|
| 6,723,166 | B2 | 4/2004 | Kuhn et al. |
| 6,780,243 | B1 | 8/2004 | Wang et al. |
| 9,816,200 | B2 | 11/2017 | Masuda et al. |
| 11,078,599 | B2 | 8/2021 | Jang et al. |
| 2003/0029376 | A1 | 2/2003 | Snyder et al. |
| 2010/0024719 | A1 | 2/2010 | Vanmil et al. |
| 2011/0226182 | A1 | 9/2011 | Sasaki et al. |
| 2012/0000415 | A1 | 1/2012 | D'Evelyn et al. |
| 2012/0285370 | A1 | 11/2012 | Gupta et al. |
| 2013/0157442 | A1 | 6/2013 | Bondokov et al. |
| 2013/0174784 | A1 | 7/2013 | Kondo |
| 2013/0327265 | A1 | 12/2013 | Inoue et al. |
| 2014/0352607 | A1 | 12/2014 | Kim et al. |
| 2014/0363607 | A1 | 12/2014 | Sato et al. |
| 2016/0002820 | A1 | 1/2016 | Hori et al. |
| 2016/0160386 | A1 | 6/2016 | Masuda et al. |
| 2017/0145591 | A1 | 5/2017 | Yoshida |
| 2018/0057925 | A1 | 3/2018 | Ma et al. |
| 2018/0066380 | A1 | 3/2018 | Tani et al. |
| 2018/0290893 | A1 | 10/2018 | Dukes et al. |
| 2020/0123678 | A1 | 4/2020 | Ko et al. |
| 2020/0149190 | A1 | 5/2020 | Fujikawa |
| 2020/0199777 | A1 | 6/2020 | Drachev et al. |
| 2020/0354856 | A1 | 11/2020 | Gao et al. |
| 2022/0010457 | A1 | 1/2022 | Ebner et al. |

FOREIGN PATENT DOCUMENTS

| | | |
|---|---|---|
| CN | 103620095 A | 3/2014 |
| CN | 204982130 U | 1/2016 |
| CN | 105308223 A | 2/2016 |
| CN | 106894089 A | 6/2017 |
| CN | 108374197 A | 8/2018 |
| CN | 110016718 A | 7/2019 |
| CN | 110331438 A | 10/2019 |
| CN | 110541199 A | 12/2019 |
| CN | 110904509 A | 3/2020 |
| CN | 111074339 A | 4/2020 |
| CN | 110541199 B | 7/2020 |
| CN | 112663134 A | 4/2021 |
| DE | 3441707 A1 | 5/1986 |
| DE | 3448179 C2 | 10/1988 |
| DE | 102015212323 A1 | 1/2016 |
| DE | 102018129492 A1 | 5/2020 |
| EP | 3260582 A1 | 12/2017 |
| EP | 3666934 A1 | 6/2020 |
| GB | 2423307 A * | 8/2006 ........... C30B 23/005 |
| JP | H11268989 A | 10/1999 |
| JP | 4061700 B2 | 3/2008 |
| JP | 2012066959 A | 4/2012 |
| JP | 2015168600 A | 9/2015 |
| JP | 2018118874 A | 8/2018 |
| JP | 6640680 B2 | 2/2020 |
| KR | 20130013709 A | 2/2013 |
| KR | 20130083654 A | 7/2013 |
| RU | 2633909 C1 | 10/2017 |
| TW | 539783 B | 7/2003 |
| TW | 201504488 A | 2/2015 |
| TW | 201522727 A | 6/2015 |
| TW | 201807272 A | 3/2018 |
| TW | 202018136 | 5/2020 |
| TW | 202028548 A | 8/2020 |
| WO | 0104390 A1 | 1/2001 |
| WO | 2012144872 A2 | 10/2012 |
| WO | 2013015630 A2 | 1/2013 |
| WO | 2015012954 A1 | 1/2015 |
| WO | 2018183585 A1 | 10/2018 |
| WO | 2019144804 A1 | 8/2019 |
| WO | 2020087723 A1 | 5/2020 |

OTHER PUBLICATIONS

International Search Report in PCT/AT2021/060340, mailed Jan. 4, 2022.
International Search Report in PCT/AT2021/060341, mailed Dec. 21, 2021.
International Search Report in PCT/AT2021/060342, mailed Dec. 23, 2021.
International Search Report in PCT/AT2021/060343, mailed Dec. 10, 2021.
International Search Report in PCT/AT2021/060344, mailed Dec. 6, 2021.

* cited by examiner

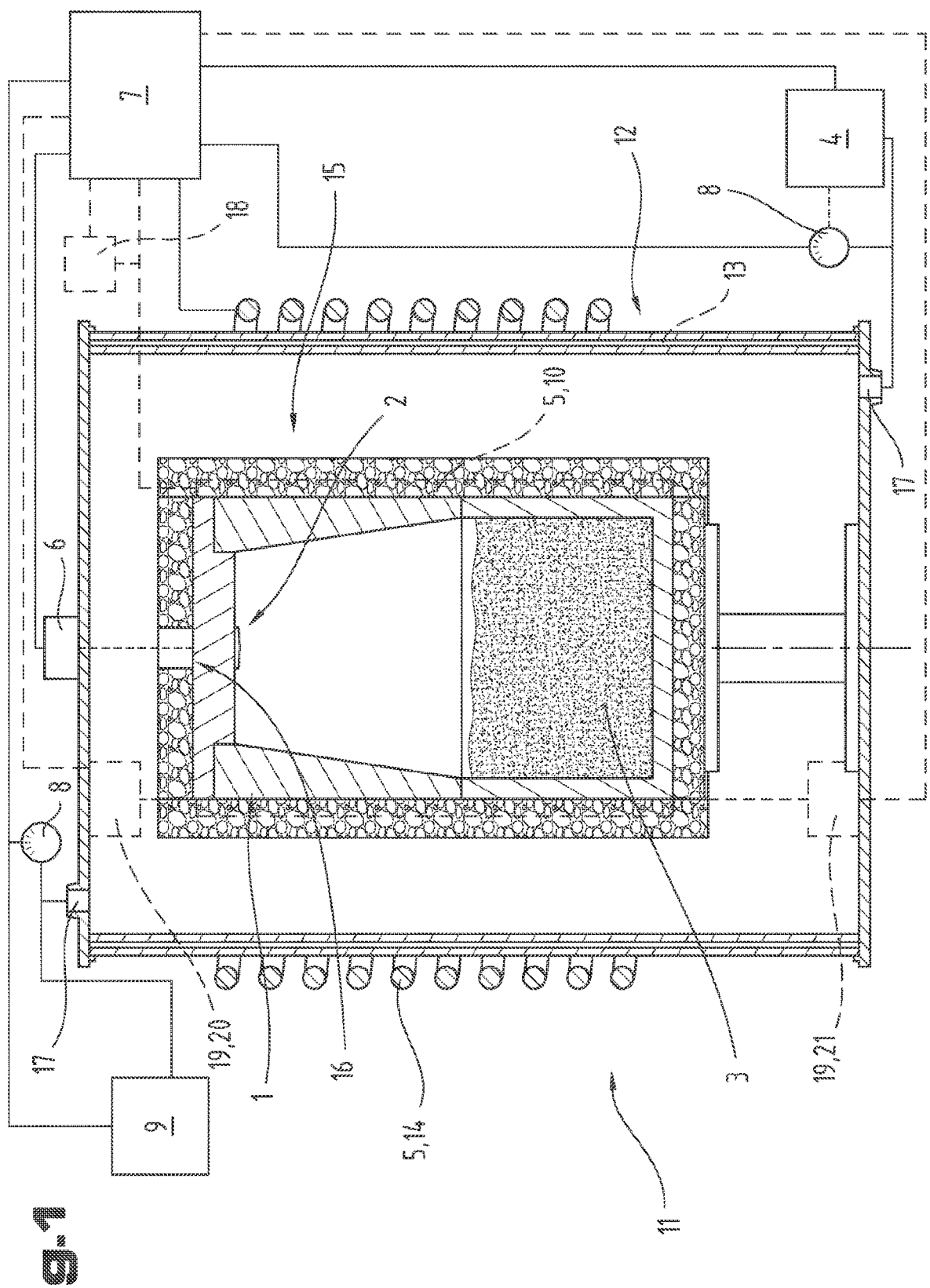

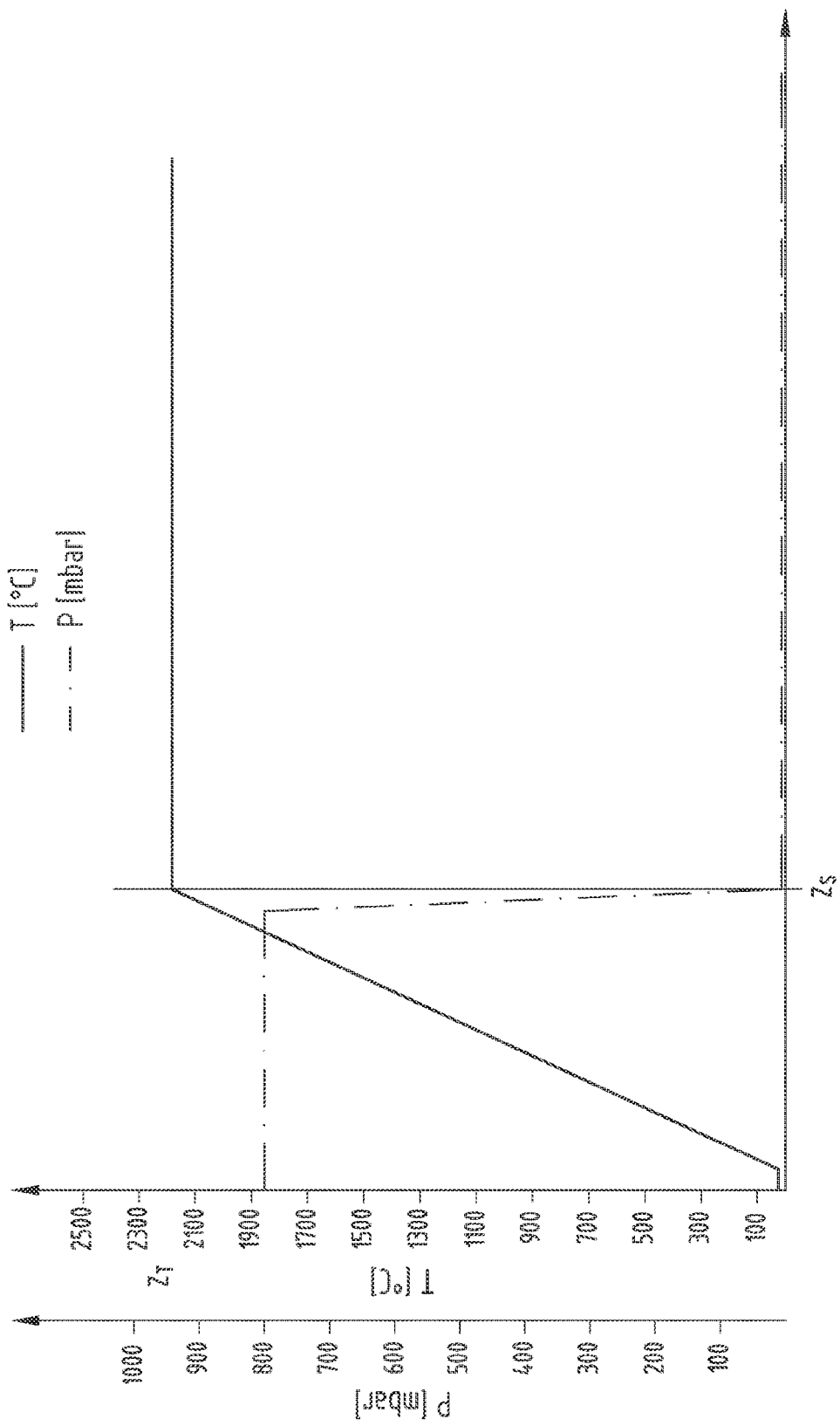

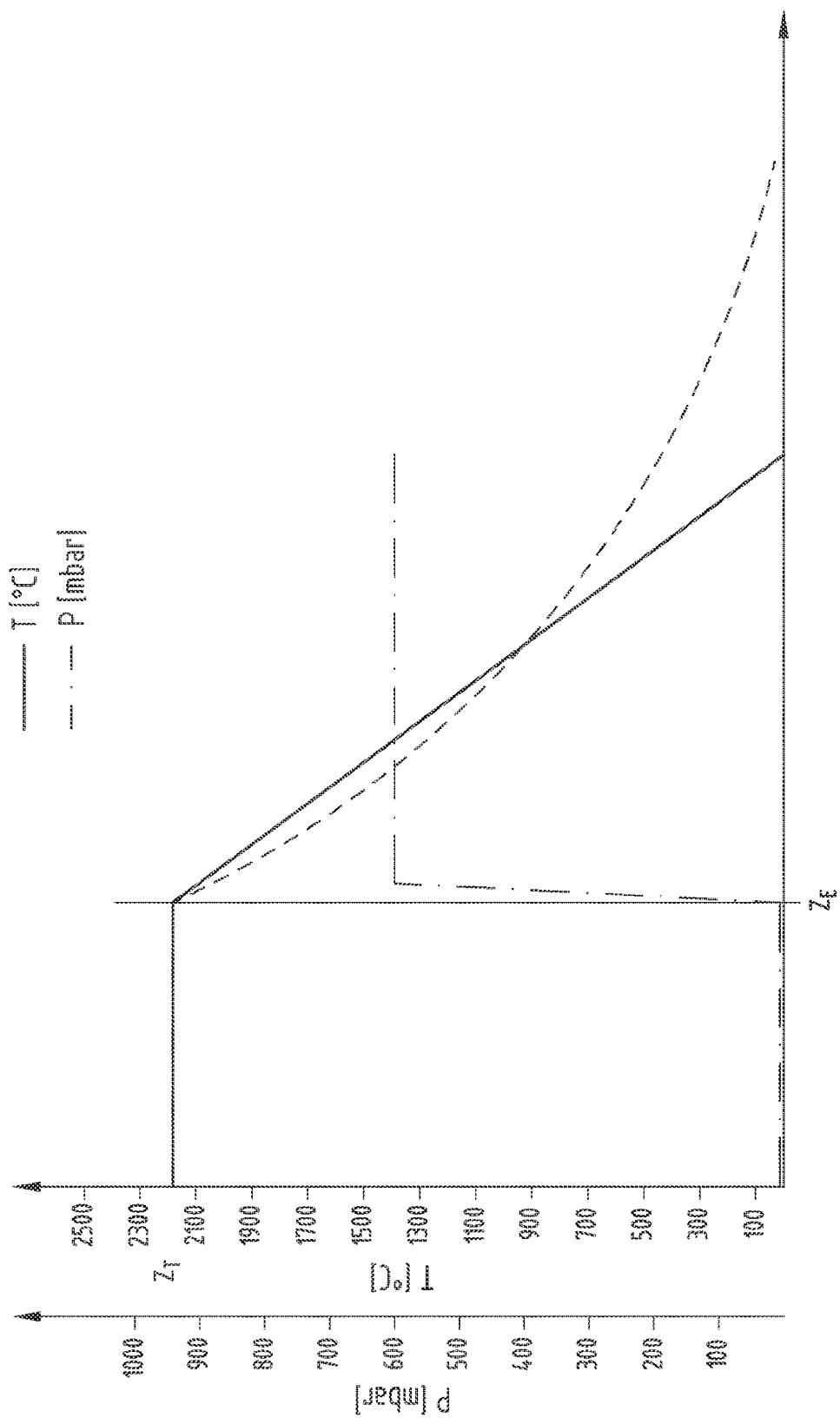

METHOD FOR GROWING CRYSTALS

CROSS REFERENCE TO RELATED APPLICATIONS

This application is the National Stage of PCT/AT2021/060343 filed on Sep. 23, 2021, which claims priority under 35 U.S.C. § 119 of Austrian Application No. A 50821/2020 filed on Sep. 28, 2020, the disclosure of which is incorporated by reference. The international application under PCT article 21(2) was not published in English.

The invention relates to a method for growing crystals by means of PVT or PVD or CVD or epitaxial sublimation, comprising the steps;
providing a chamber for the crystal growth;
providing a crucible, which is arranged in the chamber, and which crucible comprises at least one deposition section with a seed crystal and a base material for growing a crystal;
providing at least one temperature monitoring device, in particular a pyrometer,
providing a gas supply device and at least one fluid inlet and outlet,
providing a pressure monitoring device,
evacuating the chamber by means of a pumping device
flushing the chamber with an inert gas,
heating the chamber to a growth temperature of 2000 to 2400° C. by means of at least one heating device;
decreasing the pressure to 0.1 to 100 mbar;
supplying a dopant, preferably nitrogen (during a growth process);
regulating the process parameters in the growth process
increasing the pressure in the chamber at the end of the growth process
cooling down the chamber.

In methods for growing SiC single crystals, silicon carbide as a base material is arranged in a region of a crucible and at least one SiC crystal is arranged at a deposition section. In this process, the SiC of the base material is heated until it sublimates and is transferred into a gas phase. The components of the gas phase are transported to the crystal, where they are deposited.

For this growth phase, the crucible is heated to the appropriate growth temperature. By means of evacuation and subsequent application with inert gas, a certain pressure is set for the heating phase, which is higher than the pressure of the growth phase.

In this regard, the gas phase resulting from the sublimation comprises, inter alia, pure silicon (Si) as well as carbide compounds ($Si_2C$, $SiC_2$, SiC). This gas mixture is transported in an inert gas atmosphere in the direction of the SiC crystal and deposits on the same.

In the area of crystal growth, this method is known as physical vapor transport, or PVT method, and is already mentioned often in the prior art.

The disadvantage in known methods from the prior art is that, due to the even only slightly different base materials and if the crucible is not optimally sealed until the growth phase is reached, or even during the growth phase, often a proportion of silicon may diffuse out of the crucible and/or may escape with the gas phase and, hence, is no longer available for deposition on the crystal. In extreme cases, this may even lead to a depletion in silicon and the process must thus be prematurely terminated.

It was the object of the present invention to overcome the disadvantages of the prior art and to provide a method, by means of which a user is capable of reducing the loss of silicon and ensuring an improved profitability.

This object is achieved according to the invention by a method of the initially mentioned type in that the heating of the chamber from an ambient temperature to the growth temperature occurs within 10 to 10000 minutes.

By means of the method according to the invention, the escaping of silicon with the gas phase can be reduced by a significant amount, and the process conditions and profitability can be improved by keeping the time until reaching the growth temperature as short as possible.

It has proven advantageous if an open loop and closed loop control device is provided, which is connected to the at least one temperature monitoring device and the at least one heating device and regulates a heating power dependent on a temperature measured. By this measure, a deviation from the optimal process temperature can be significantly reduced.

It is further preferred if the open loop and closed loop control device is connected to the gas supply device and pressure monitoring device and regulates the pressure of the chamber dependent on the temperature. By this measure, a deviation from the optimal process pressure can be significantly reduced.

Moreover, it may be provided that the at least one heating device comprises an RF coil and/or a resistance heater. This embodiment may contribute to an improved temperature distribution in the crucible.

Preferably, at least one measuring device is provided, which measuring device determines the Si and/or C content of the gas phase in the chamber. Hence, an escaping of the gas phase from the crucible and a silicon loss can be determined.

It is advantageous if the measuring device comprises a spectroscopic measuring device, in particular atomic absorption spectrometry (AAS) or mass spectrometry. This embodiment may be advantageous for determining an escaping of the gas phase, and the equilibrium thus controls the concentration in the gas phase.

Furthermore, it may be provided that the measuring device comprises a resistance measurement, which detects a change in a specific resistance due to the deposition of Si.

It may be advantageous that the open loop and closed loop control device is connected to the at least one measuring device and regulates the heating power and/or the pressure dependent on the determined Si and/or C content of the measuring device. This embodiment further improves the adherence to optimal process conditions.

Moreover, the cooling of the chamber can be carried out in a regulated manner with a cooling speed of 0.1 to 30° C./min. This embodiment may contribute to an improved quality of the crystal.

Furthermore, the cooling of the chamber may be carried out by means of a cooling fluid or cooling gases, such as hydrogen or helium. Thus, an improved controlled cooling process is ensured.

The cooling of the chamber may preferably be carried out by controlling the heating power by means of the open loop and closed loop control device.

According to a variant of the invention that is advantageous regarding the quality and structure of the crystals, it may be provided that the chamber is brought to a pressure of 700 to 900 mbar during flushing with the inert gas, wherein argon is preferably used as the inert gas.

For the purpose of better understanding of the invention, it will be elucidated in more detail by means of the figures below.

These show in a respectively very simplified schematic representation:

FIG. 1 a schematic structure of a device for growing crystals by means of gas phase transport;

FIG. 2 a course of a heating ramp according to the invention;

FIG. 3 an embodiment of a cooling ramp.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

FIG. 1 shows a schematic structure of a device for growing crystals.

In this regard, the chamber 11 is designed as a reaction chamber, the wall 12 of which is preferably made of quartz glass, as is known from the prior art.

As is shown, the wall 12 may consist of quartz glass with one or multiple walls, wherein a coolant 13 may be arranged between the walls 12.

On its upper and lower end, the chamber 11 is sealed and moreover comprises fluid inlets and outlets. Around the wall 12, for example an RF coil 14 may be arranged, which is provided for heating the device.

Different devices for holding and positioning a crucible 1 may be arranged in the chamber 11, among others also a rotary unit, on which a crucible 1 is placed.

The crucible 1 may be designed to have one or multiple parts, comprises essentially a cover, a side wall and a bottom, into which a base material 3 to be sublimated is filled. The crucible 1 is preferably made of high-purity graphite materials and has a certain porosity. However, the crucible 1 may further also be made of other suitable materials, such as carbides, oxides, or nitrides.

Additionally, the crucible 1 may be surrounded by a so-called susceptor, which may also consist of a graphite material and contributes to the homogenization of the heat input, which susceptor is not shown.

An insulation 15 is arranged around the crucible 1, which insulation 15 consists of a material with higher porosity, and which may preferably also consist of graphite materials, for example graphite felt, and has a considerably lower thermal conductivity than the crucible 1. In this regard, the insulation 15 may be assembled from multiple parts. However, other materials, which are suitable for these temperature ranges, may also be used as long as they do not influence the gas phases and/or react with them.

The insulation 15 may preferably have a recess 16 on the cover, which recess 16 is arranged particularly in the region of the seed crystal 2 and forms a cooling zone, which leads to a temperature gradient and contributes to an axial temperature gradient. As an alternative, a material having a higher thermal conductivity than the insulations may also be used instead of the recess 16.

The measurement of the temperature occurs, for example, by means of a temperature monitoring device 6 on the crucible 1, for example with the aid of a pyrometer, in particular a ratio pyrometer. As shown, the measurement may be carried out by means of a pyrometer in the region of the recess 16, however, it is also possible for multiple pyrometers to be arranged, and/or other regions may be measured and may furthermore comprise recesses.

Prior to the beginning of the process, the crucible 1 is cleaned under a specific atmosphere, for example by means of an alcohol in a cleanroom.

The seed crystal 2 to be used is then fastened to the cover.

The crucible 1 is filled with the base material 3, silicon carbide having a purity of >5N is used for growing monocrystalline SiC. Dependent on the crystal to be grown, an amount of about 2-8 kg SiC powder is used.

Subsequently, the crucible 1 is closed and provided with the insulation 15.

Afterwards, the crucible 1 is placed on a crucible holder inside a furnace chamber, and the furnace chamber is subsequently closed. In this regard, the wall 12 usually has a cylindrical design.

In further consequence, the furnace chamber is pumped out by means of a pumping device 9, for example a high vacuum pump and/or turbomolecular pump. In this process, the chamber 11 may already be heated, so that volatile constituents of impurities can escape.

The chamber 11 is then pressurized with a process pressure of approximately 700 to 900 mbar. In this process, inert gas, preferably argon, is introduced by means of a gas supply device 4, wherein helium, for example, would also be possible as an alternative. Optionally, a doping gas may also already be introduced.

The arrangement of the gas supply device 4 and the pumping device 9 may also be reversed, so that the pumping device 9 is arranged on the lower fluid inlet and outlet 17 and the gas supply device 4 on the upper one. Alternatively, the gas supply device 4 and the pumping device 9 may also be arranged on the same fluid inlet and outlet 17. Likewise, more than one gas supply device 4 and pumping device 9 may be used.

Afterwards, a heating phase takes place from an initial temperature to a growth temperature in a range of between 2000° C. and 2400° C. From a temperature of about 2000° C. on, the sublimation of the SiC base material 3 to the gas phase Si, $Si_2C$, $SiC_2$ occurs under a decreased pressure. Due to the axial temperature gradient, a transport in the direction of the seed crystal 2 starting from the base material 3 occurs. The process pressure influences the diffusing behavior of the sublimated SiC. Here, the growth process is still inhibited by the high total pressure.

A value of a mean heating temperature from the beginning of the heating to reaching the process temperature is, in this regard, 0.24 to 240° C./min.

The heating process may take place inductively with an RF-coil 14 by means of an RF generator, or also with a resistance heater 10, and/or a combination thereof, which may result in a quick attainment and improved distribution of the temperature.

In this regard, the resistance heater 10 may be arranged around the crucible 1 and/or also below and/or in regions above the crucible 1.

When reaching the growth temperature, the pressure is regulated to 0.1 to 100 mbar.

A further factor to be considered here for the heating and subsequent maintaining of the temperature is the heat loss due to convection, as, when reaching the growth pressure, the heat transfer is also reduced at a reduced pressure, due to the gases surrounding the crucible 1 and the insulation.

Due to the graphite materials used, a carbon source is always present. A formation of $SiC_2(g)$ may take place on the crucible walls, as well.

Here, the material transport takes place in the temperature gradient between the base material 3 and the seed crystal 2. It can be divided into 3 parts: the sublimation of the base material, the transport through the gas phase and the crystallization on the substrate. After the supersaturation of the gas phase, a deposit occurs on the crystal surface.

With respect to the distance between the crystal and the base material, the temperature gradient between the source to be sublimated and the growing crystal decreases in the course of the growth process.

During the growth process, a doping gas, preferably nitrogen, is introduced by means of a gas supply device 4, which gas may diffuse inside through the crucible walls. The introduction of nitrogen may be carried out by a mass flow controller and/or gas flow controller, which is arranged in the gas supply device 4. Moreover, the nitrogen may be supplied to the process gas.

In case of deviations in the growth conditions, there might be a carbon enrichment, so that the growth atmosphere becomes depleted of silicon. This may, in turn, lead to a graphitization of the base material and to a change in the material transport in the crucible 1 as the sublimation rate of the base material 3 may decrease because of this.

If the vapor pressure of the Si gas phase is too high, a silicon loss may occur. The porosity of the crucible 1 also plays a vital role in this.

In this process, a siliconizing of the graphite, among other things, may occur. These conditions require an active regulation of the process parameters.

As shown, an open loop and closed loop control device 7 is provided, which monitors and controls the process parameters in a centralized or decentralized manner. In this regard, multiple pressure monitoring devices 8 may be arranged, which are connected to the gas supply device 4 and the open loop and closed loop control device 7.

The open loop and closed loop control device 7 can further be connected to the heating device as well as the temperature monitoring device 6, and, inter alia, control the heating power.

In this process, the thermal inertia of the system is taken into account, so that a heating power is regulated early enough and unnecessary overheating or unfavorable process conditions cannot be brought about.

Furthermore, a measuring device may be provided in connection with the open loop and closed loop control device 7, for example a spectroscopic measuring device 19, which determines the content of Si and/or C in the gas phase, for example atomic absorption spectrometry. In this regard, the measuring device 18 may be arranged in the region of the insulation 15, and a measurement may take place inside it. However, the measurement may also take place in the chamber 11, outside the insulation 15. In the case of an arrangement inside the insulation 15, it must be designed accordingly, so that a measuring region is provided, as the spectroscopic measuring device 19 comprises a source 20 and a detector 21. This embodiment is advantageous also because a gas phase necessary for the method is present anyway.

For example, when using a resistance heater 10, a measuring device may be provided, which determines the deposit from the gas phase on the heating elements with the aid of a resistance measurement 18, and thus, a conclusion regarding the gas phase proportions escaped from the crucible 1 can be drawn.

In this process, the open loop and closed loop control device 7 can determine, by means of the values of the spectroscopic measuring device 19 and/or the resistance measurement 18, whether too large of a proportion of Si has already escaped and the process has to be terminated.

FIG. 2 shows a course of a heating ramp according to the invention. The dash-dotted line represents the pressure progression. The pressure is initially set to a range between 700 and 900 mbar while the heating process takes place. The initial temperature in this process is about 25° C. The crucible is heated by 0.24 to 240° C./min. When and/or shortly before reaching the growth temperature $Z_T$ at the start of the growth $Z_S$, the pressure is reduced to a value between 0.1 and 100 mbar, and the growth phase begins.

Furthermore, it may be provided that in the time window from the start of the sublimation of the silicon carbide to reaching the growth temperature, the heating process is further accelerated, so that as little SiC as possible can be sublimated and escape before the start of the growth $Z_S$.

After reaching the growth temperature $Z_T$ and after setting the growth pressure, the actual crystal growth begins. In this process, the process parameters pressure, temperature and heating power are kept essentially constant. The growth rate of the crystal amounts to about 150 to 300 μm/h. The process cycle lasts approximately 5 days.

After the end of the process, the heating power is reduced or shut off. The chamber is supplied with an increased pressure and cools down. The device cools down, in this regard, mostly due to heat radiation, as FIG. 3 shows.

FIGS. 3 and 2 show variants of a cooling process. An ordinary cooling process and a controlled cooling process are shown in comparison here. In the ordinary cooling process, the heating power is usually deactivated upon the end of the growth $Z_E$, and the device cools down autonomously during the increase of the pressure, which leads to a curved progression, as adumbrated in dashed lines.

In the case of the controlled cooling process, the heating power is reduced in a controlled manner, and the chamber is optionally supplied with a cooling fluid or cooling gas, so that an essentially constant cooling ramp is formed. The cooling rate of this process amounts to 0.1 to 30 C/min.

For this purpose, the gas supply device may comprise a cooling device and/or temperature control device, which serve to regulate the temperature in a controlled cooling, in addition to the gas flow controller. In order to prevent thermal stresses, a targeted cooling process is advantageous. The cooling process can thus be, in turn, guided by the open loop and closed loop control device in a controlled manner. In the course of this, the heating power may also be regulated accordingly. In this context, cooling is understood to mean a lowering of the temperature based on the current temperature, thus, at a high temperature, a cooling fluid may also have a higher temperature than in ambient conditions but still lower than the current temperature.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the technical teaching provided by the present invention lies within the ability of the person skilled in the art in this technical field.

The scope of protection is determined by the claims. Nevertheless, the description and drawings are to be used for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

LIST OF REFERENCE NUMBERS

1 Crucible
2 Seed crystal
3 Base material
4 Gas supply device
5 Heating device
6 Temperature monitoring device
7 Open loop and closed loop control device
8 Pressure monitoring device
9 Pumping device
10 Resistance heater
11 Chamber
12 Wall
13 Coolant
14 RF coil
15 Insulation
16 Recess
17 Fluid inlet and outlet
18 Resistance measurement
19 Spectroscopic measuring device
20 Source
21 Detector

The invention claimed is:

1. A method for growing crystals by means of PVT or PVD or CVD or epitaxial sublimation, comprising the steps;
providing a chamber (11) for the crystal growth;
providing a crucible (1), which is arranged in the chamber (11), and which crucible (1) comprises at least one deposition section with a seed crystal (2) and a base material (3) for growing a crystal;
providing at least one temperature monitoring device (6),
providing a gas supply device (4) and at least one fluid inlet and outlet (17),
providing a pressure monitoring device (8),
evacuating the chamber (11) by means of a pumping device (9)
flushing the chamber (11) with an inert gas,
heating the chamber (11) to a growth temperature of 2000 to 2400° C. by means of at least one heating device (5);
decreasing the pressure to 0.1 to 100 mbar;
supplying a dopant;
regulating the process parameters in the growth process
increasing the pressure in the chamber (11) at the end of the growth process
cooling down the chamber (11)
wherein the heating of the chamber (11) from an ambient temperature to the growth temperature occurs within 10 to 10000 minutes and
wherein a resistance measuring device is provided, wherein the resistance measuring device determines the Si and/or C content in the gas phase in the chamber (11) by a resistance measurement (18), which detects a change in a specific resistance due to the deposition of Si.

2. The method according to claim 1, wherein an open loop and closed loop control device (7) is provided, which is connected to the at least one temperature monitoring device (6) and the at least one heating device (5) and regulates a heating power dependent on a temperature measured.

3. The method according to claim 2, wherein the open loop and closed loop control device (7) is connected to the gas supply device (4) and pressure monitoring device (8) and regulates the pressure of the chamber (11) dependent on the temperature.

4. The method according to claim 1, wherein the at least one heating device (5) comprises an RF coil (14) and/or a resistance heater (10).

5. The method according to claim 1, wherein a spectroscopic measuring device (19) is further provided.

6. The method according to claim 2, wherein the open loop and closed loop control device (7) is connected to the resistance measuring device and regulates the heating power and/or the pressure dependent on the Si and/or C content determined by the resistance measuring device.

7. The method according to claim 1, wherein the cooling of the chamber (11) is carried out in a regulated manner with a cooling speed of 0.1 to 30° C./min.

8. The method according to claim 1, wherein the cooling of the chamber (11) is carried out by means of a cooling fluid.

9. The method according to claim 2, wherein the cooling of the chamber (11) is carried out by controlling the heating power by means of the open loop and closed loop control device (7).

10. The method according to claim 1, wherein the chamber (11) is brought to a pressure of 700 to 900 mbar during flushing with the inert gas.

11. The method according to claim 1, wherein the at least one temperature monitoring device (6) comprises a pyrometer and the dopant is nitrogen.

12. The method according to claim 5, wherein the spectroscopic measuring device (19) is an atomic absorption spectrometry (AAS) measuring device or a mass spectrometry measuring device.

13. The method according to claim 10, wherein the inert gas is argon.

* * * * *